United States Patent [19]
Tanaka

[11] Patent Number: 5,640,418
[45] Date of Patent: Jun. 17, 1997

[54] EQUALIZER, RECEPTION SYSTEM HAVING AN EQUALIZER, DATA CONVERSION METHOD AND APPARATUS THEREOF

[75] Inventor: Koichi Tanaka, Yamato, Japan

[73] Assignee: Canon Kabushiki Kaisha, Tokyo, Japan

[21] Appl. No.: 416,453

[22] Filed: Apr. 3, 1995

Related U.S. Application Data

[63] Continuation of Ser. No. 30,659, Mar. 12, 1993, abandoned.

[30] Foreign Application Priority Data

Mar. 16, 1992 [JP] Japan .................................. 4-057796

[51] Int. Cl.$^6$ ........................................................ H03H 7/40
[52] U.S. Cl. ............................................ 375/232; 364/724.2
[58] Field of Search ............................ 364/724.2; 375/729, 375/230, 231, 232, 235, 317, 345; 333/18

[56] References Cited

U.S. PATENT DOCUMENTS

| | | | |
|---|---|---|---|
| 4,343,041 | 8/1982 | Forney, Jr. ............................ | 375/14 |
| 4,355,402 | 10/1982 | Kromer, III et al. .................. | 375/11 |
| 4,580,275 | 4/1986 | Pirani et al. .......................... | 375/16 |
| 4,799,180 | 1/1989 | Suzuki .................................. | 364/724.2 |
| 5,016,205 | 5/1991 | Shumway ............................ | 375/345 |
| 5,159,609 | 10/1992 | Palicot ................................ | 375/14 |
| 5,210,774 | 5/1993 | Abbiate et al. ...................... | 374/14 |

*Primary Examiner*—Stephen Chin
*Assistant Examiner*—Kevin Kim
*Attorney, Agent, or Firm*—Morgan & Finnegan LLP

[57] ABSTRACT

Apparatus and method for minimizing a data error, in case of fault, by detecting a sudden level fluctuation by hit or impulse noise of an input signal, level recovery, and error variance based on the error judged from the equalized signal, and updating a tap coefficient of an adaptive tap coefficient in accordance with the result of detection.

30 Claims, 7 Drawing Sheets

EQUALIZER, RECEPTION SYSTEM HAVING AN EQUALIZER, DATA CONVERSION METHOD AND APPARATUS THEREOF

This is a continuation of application Ser. No. 08/030,695, filed on Mar. 12, 1993 abandoned.

BACKGROUND OF THE INVENTION

The present invention relates to an equalizer or reception system having an equalizer which updates a tap coefficient of the equalizer and a data in method and apparatus which convert the data format in order to perform D/A conversion on the data processed by a floating-point type digital signal processor.

Conventionally, a data modem performs data transmission through a public line, but its environment is not sufficient. That is, the public line is ordinary designed for audio transmission, therefore, there are various disadvantages for data communication. For example, a signal which goes through the line is influenced by hit, sudden level fluctuation, and impluse noise. This is not a problem in case of audio signal transmission, however, has enormous influence to data error rate in case of data communication.

For example, in a reception signal processing unit of a data modem based upon CCITT recommendation V. 27 ter, V. 29, traceability of an auto gain controller (AGC) is delayed purposely for stable demodulation during the data reception. Therefore, where a reception signal level is suddenly flucatuated, the gain of the AGC becomes an improper value, resulting in generation of errors in the demodulated signal. In the case where a hit or impulse noise is generated, since the reception signal contains the error, a correct demodulated signal cannot be obtained.

An adaptive equalizer, in particular, updates a tap coefficient by using the demodulated signal. If the demodulated signal is not correct, the tap coefficient also contains an error and equalization cannot be performed. Furthermore, an adaptive equalizer is not capable of resetting the tap coefficient during data reception and the operation cannot be properly performed until training data is received again. That is, a burst error occurs during this period. The above-described cases need to be avoided in the adaptive equalizer.

Figure 8:
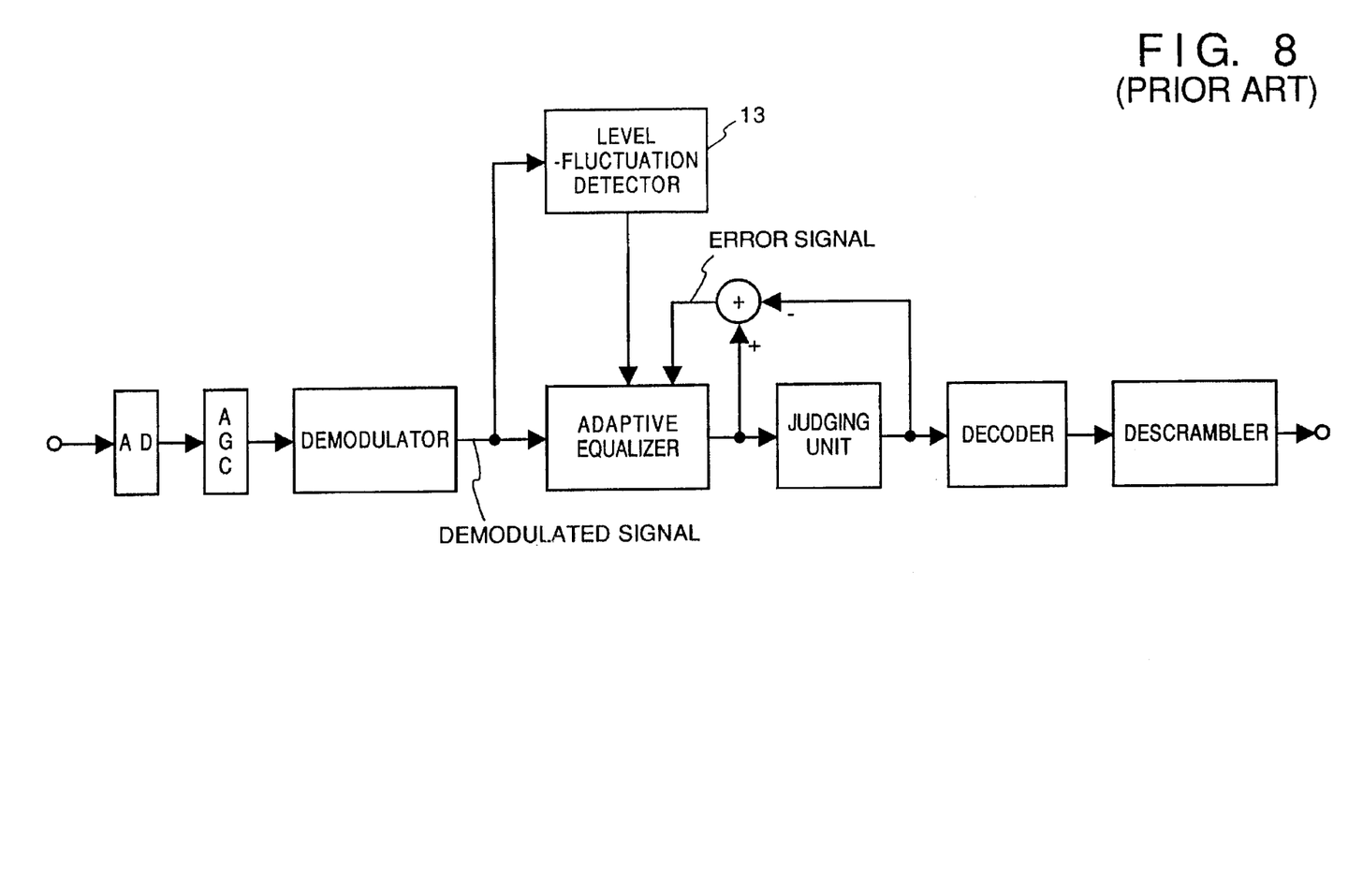
FIG. 8 is a block diagram illustrating the construction of a reception signal processing unit in the prior art.

For the above reason, a data modem as shown in FIG. 8 detects fluctuations in the reception signal level by a level-fluctuation detector 13 in order to suspend updating the tap efficient of the adaptive equalizer.

However, in this level-fluctuation detector, there is a case where the level fluctuation cannot be detected even though the gain of the AGC is unstable. For example, when a demodulated signal (complex number) in which the absolute value is rather small sequentially appeared even if the reception signal level has been suddenly risen. Accordingly, there may be a case where the tap coefficient of the adaptive equalizer is updated because the level fluctuation is not detected before the gain of the AGC reaches a stable value after the reception signal has recovered from the hit.

When the period where the hit is occurring is longer than the tracing time of the AGC, the level of the demodulated signal recovers to an appropriate value even if the carrier is not contained in the reception signal. In this case, since the level fluctuation is not detected, the tap coefficient is updated by using the signal obtained from the demodulating white noise.

However, the above-described method using the level-fluctuation detector cannot cope with the hit sufficiently. Still remaining is the problem that equalization cannot be performed because the tap coefficient has been updated in accordance with a demodulated signal containing errors.

Recently, signal processing circuit for communication and control has been developed of digital circuit. There are the following advantages in this construction:

(1) The characteristics of the circuit does not rely on the accuracy of an element and is not effected by secular change;

(2) Adjustment at production is not necessary; and (3) The circuit does not easily fluctuate with noise.

Furthermore, since capability of microprocessor has been improved, digital signal processing circuit can be constituted of software of a digital signal processor (DSP). It is possible to execute processing for a plurality of signals by a single device and processing which is suitable to an input signal. Furthermore, cost performance is improved and design change is easily performed.

When signal processing is performed by the DSP, the problem with operational error occurs. Floating-point type DSP is often used in order to minimize the influence from the operational error and obtain a wide dynamic range. To convert the digital signal processed by this DSP into an analog signal, first the data format needs to be changed from floating-point type data to two's complement type data, and then the D/A conversion is performed. Therefore, floating-point type DSP usually has an instruction to convert the floating-point type data to two's complement type data.

However, there is floating-point type DSP which, to reduce the cost, does not have the above instruction. The signal processing circuit using such a DSP needs to have additional hardware to convert the floating-point type data into two's complement type data which is provided between the DSP and D/A converter. Since this hardware is costly, the overall cost cannot be reduced.

SUMMARY OF THE INVENTION

In the light of the above drawback, it is an object of the present invention to provide an equalizer or reception system having an equalizer capable of detecting level fluctuation and level recovery of the input signal or an error variance in accordance with the judged error of an equalized signal, and updating the tap coefficient of the equalizer in accordance with the result.

It is another object to provide a data conversion method and apparatus capable of converting floating-point type data to two's complement type data by simple calculation without a hardware for conversion.

Other features and advantages of the present inventions will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

[First Embodiment]

Figure 1:
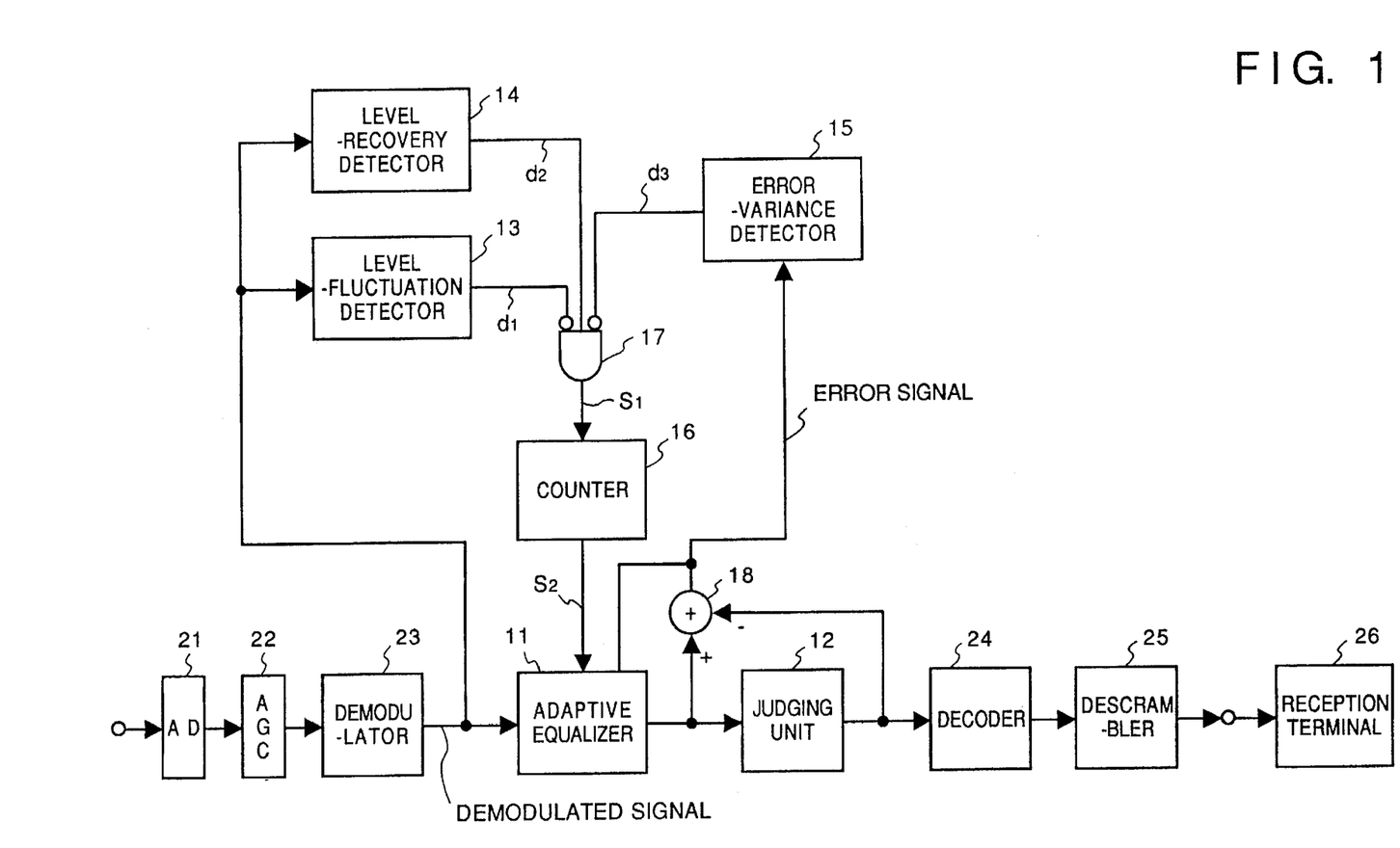
FIG. 1 is a block diagram illustrating the construction of a reception-signal processing unit in the present embodiment.

FIG. 1 is a block diagram illustrating the construction of the reception-signal processing unit of a data modem in the present embodiment. In FIG. 1, numeral 11 is an adaptive equalizer, numeral 12 is a judging unit, numeral 13 is a level-fluctuation detector, numeral 14 is a level-recovery detector, numeral 15 is an error-variance detector, numeral 16 is a counter, numeral 17 is a logic circuit, numeral 18 is subtracter, numeral 21 is an A/D converter (AD), numeral 22 is an auto gain controller (AGC), numeral 23 is a demodulator, numeral 24 is a decoder, numeral 25 is a descrambler, and numeral 26 is a reception terminal for processing and recording received data.

Figure 2:
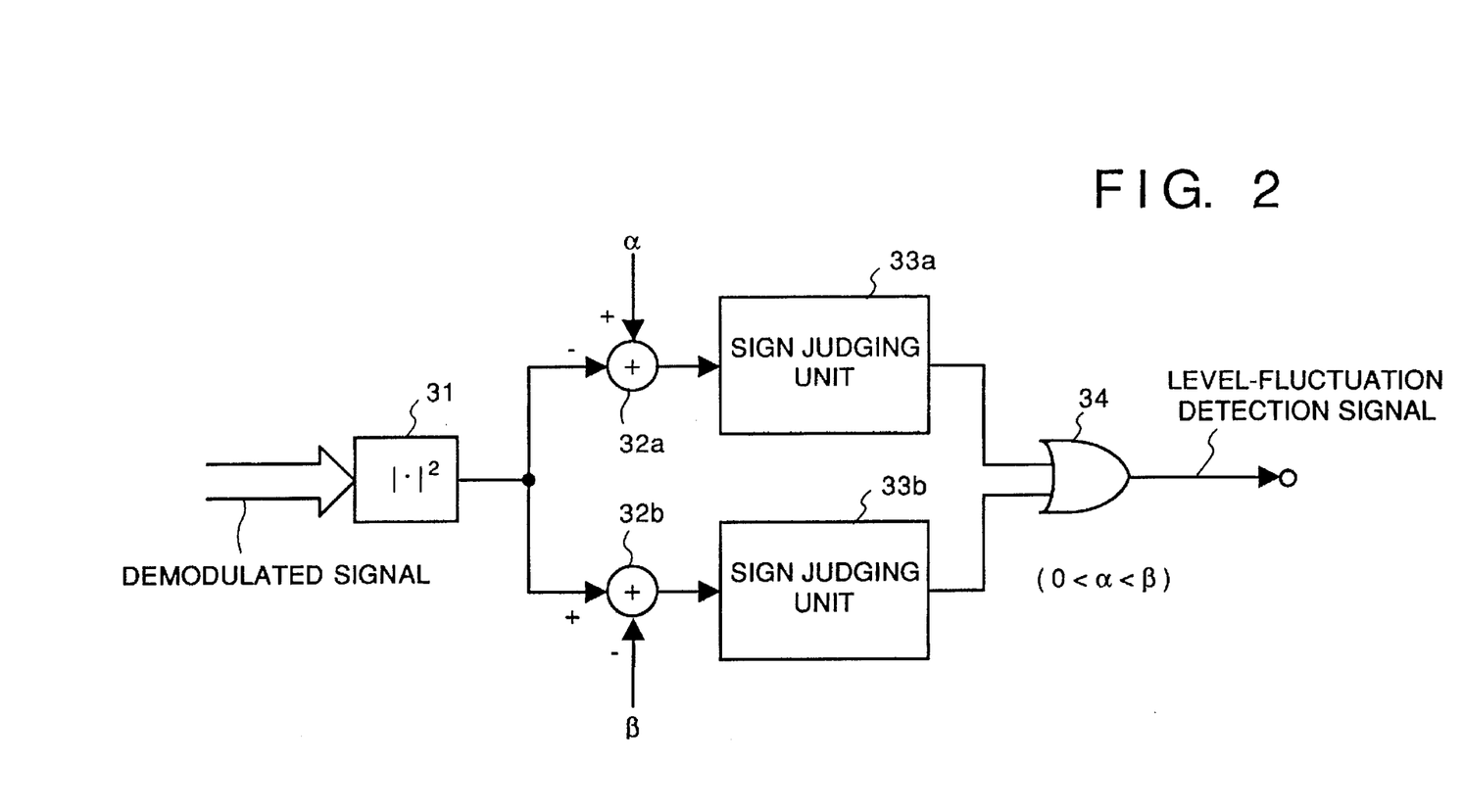
FIG. 2 is a block diagram illustrating the construction of a level-fluctuation detector.

In the above construction, when the power of a demodulated signal is out of the range of the constant between $\alpha$ and $\beta$, the level-fluctuation detector 13 determines that a hit, sudden level fluctuation, or impulse noise has occurred and the level-fluctuation detection signal $d_1$ is set to "TRUE". FIG. 2 is a diagram illustrating the construction of the level-fluctuation detector 13. In FIG. 2, numeral 31 is a power calculator for calculating the square of the absolute value of the demodulated signal. Numerals 32a and 32b are subtracters which examine the relationship between the power of the demodulated signal and constant in the range between $\alpha$ and $\beta$. Numerals 33a and 33b are sign judging units for outputting "TRUE" when the sign of an input signal is positive, "FALSE" when negative. Numeral 34 is a logic circuit for taking a logical OR of the outputs of the sign judging units $33_a$ and $33_b$.

Figure 3:
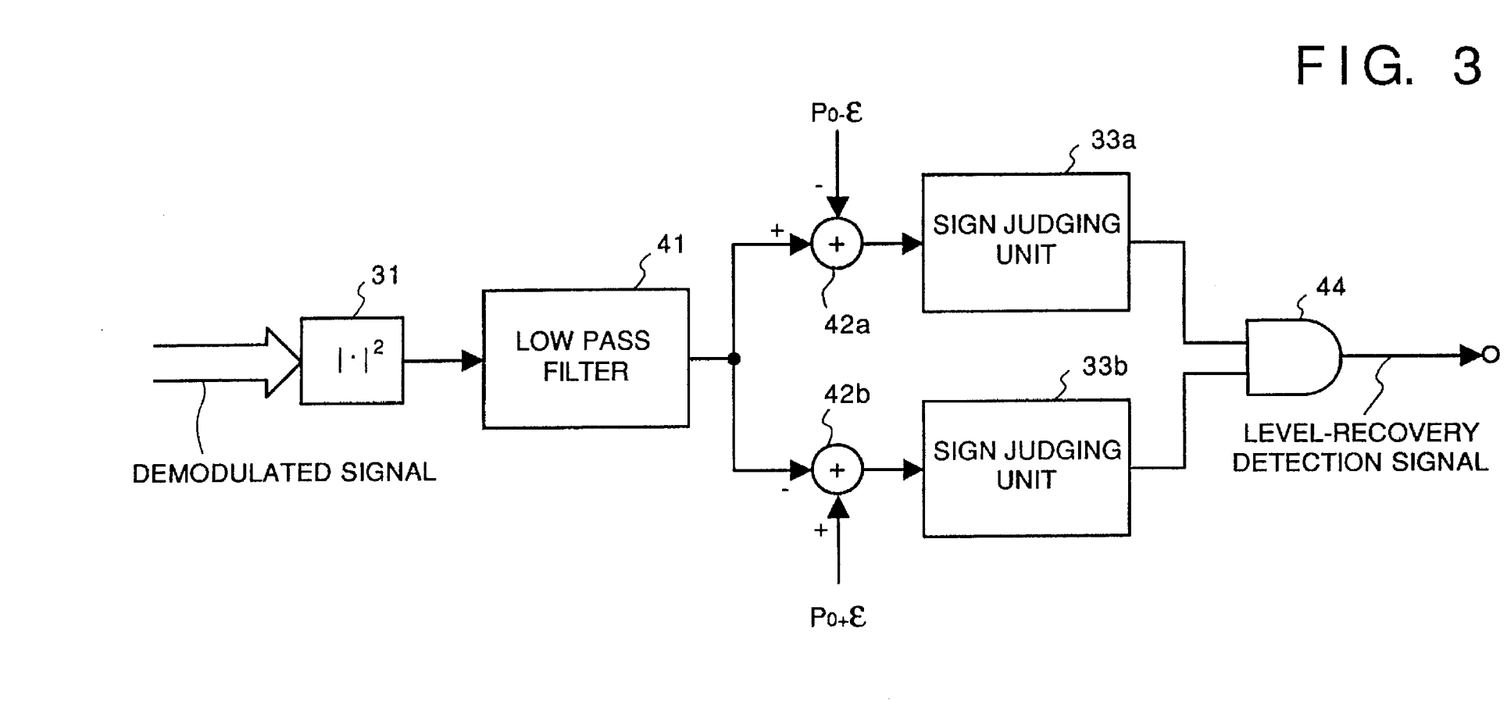
FIG. 3 is a block diagram illustrating the construction of a level-recovery detector.

In FIG. 1, when the average power of the demodulated signal is between the constants $p_0-\epsilon_-$ and $p_0+\epsilon_+$, the level-recovery detector 14 determines that the gain of the AGC has converged to an appropriate value and sets the level-recovery signal $d_2$ to "TRUE". FIG. 3 is a diagram illustrating the detailed construction of the level-recovery detector 14. Numeral 41 is a low pass filter (LPF) for obtaining an average of powers calculated by the power calculator 31. Numerals $42_a$ and $42_b$ are subtracters for examining the relationship between the average of the powers of the demodulated signal and constant in the range from $p_0-\epsilon_-$ to $p_0+\epsilon_+$ and numeral 44 is a logic circuit for taking a logical product of the outputs from the judging units $33_a$ and $33_b$.

Figure 4:
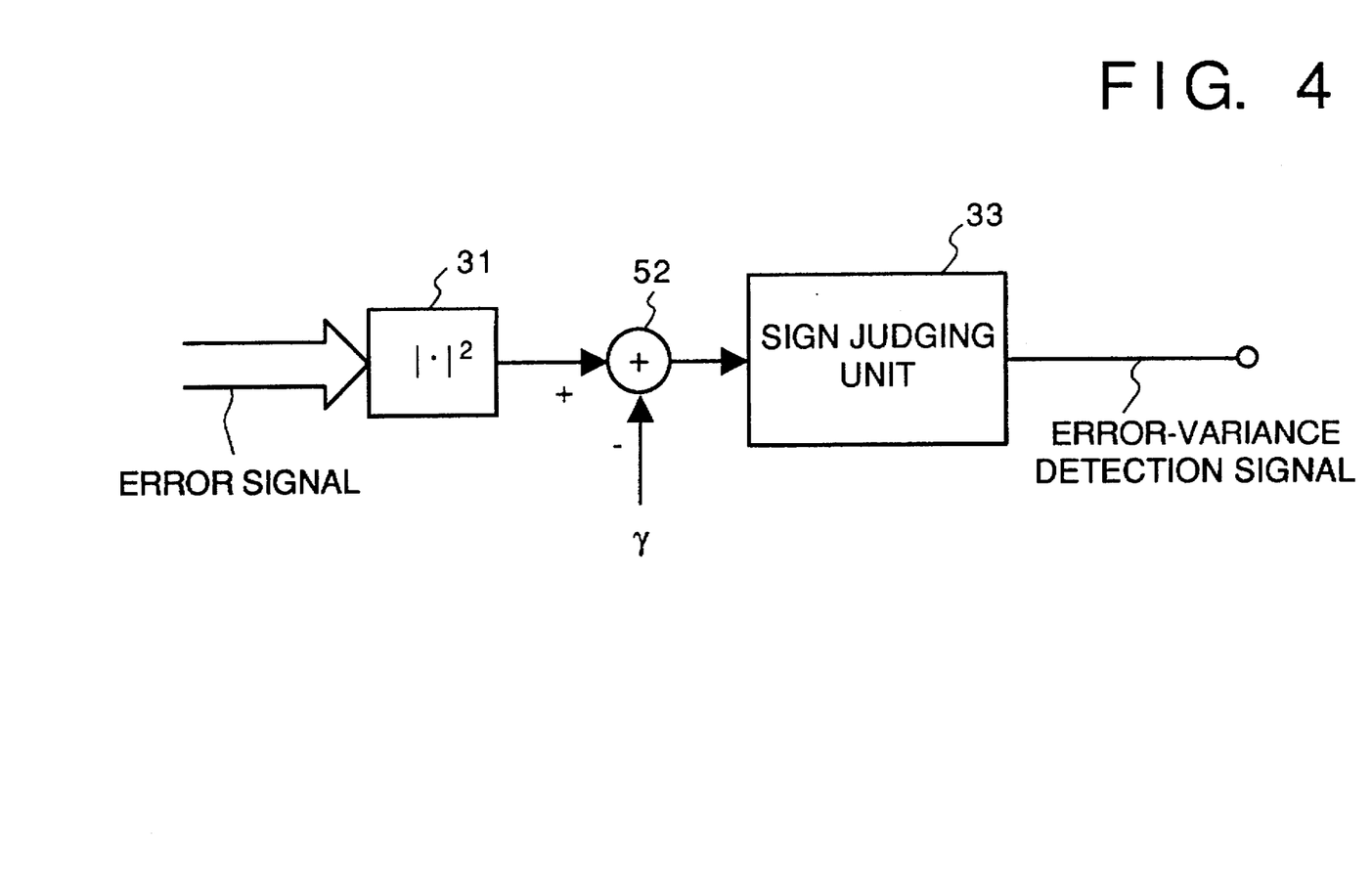
FIG. 4 is a block diagram illustrating the construction of an error-variance detector.

The error variance detector 15 determines that the error variance is considerably large when the power of the error signal is larger than the constant $\gamma$ and sets the error variance detection signal $d_3$ to "TRUE". It should be noted that the error signal, which is calculated in the subtracter 18, is the difference between the output signal of the adaptive equalizer 11 and that of the judging unit 12. FIG. 4 is a diagram illustrating the construction of the error variance detector 15. Numeral 52 is a subtracter for examining the relationship between the power of the error signal calculated by the power calculator 31 and the constant $\gamma$.

Subsequently, in the logic circuit 17, a non-fault-detection signal $S_1=/d_1\wedge d_2\wedge/d_3$ is obtained from the detection signals $d_1$, $d_2$, $d_3$. It is apparent that the signal $S_1$ is "TRUE" when a sudden fluctuation does not occur in the demodulated signal, the gain of the AGC is converged, and the error variance is small. In the counter 16 to which the signal $S_1$ is inputted, if the signal $S_1$ is continuously "TRUE" for N times, the signal $S_2$ which updates the tap coefficient is set to "TRUE".

It should be noted that "N" is a constant integer which is determined beforehand so that the demodulated data containing the error will not remain in the delay register of the adaptive equalizer 11 when the demodulated signal is recovered from the fault and updating of the tap coefficient is restarted.

As described above, according to the present invention, updating of the tap coefficient of the adaptive equalizer can be suspended, when a hit has occurred or immediately after the recovery from a hit when the error is occurring in the demodulated signal, by providing the level-fluctuation detector, level-recovery detector, error-variance detector and updating the tap coefficient of the adaptive equalizer only when there is no sudden fluctuation in the demodulated signal, the gain of the AGC is converged, and the state where the error variation is small occurs for N times.

Accordingly, it can be avoided that the adaptive equalizer comes to the state where equalization cannot be performed. There is the advantage that the data error can be minimized since the processing can immediately return to the normal reception operation after a recovery from a fault.

In the present embodiment, the power of the demodulated signal can be used in order to detect the level fluctuation and level recovery. However, this does not impose a limitation upon the present invention. For example, the power of a bandpass signal (an output signal of the AGC 22) can be used to obtain the similar result. In this case, the input signal is replaced by the bandpass signal in the detectors of FIGS. 2 and 3.

[Second Embodiment]

The other embodiment of the present invention will now be described in detail in accordance with the accompanying drawings.

Figure 5:
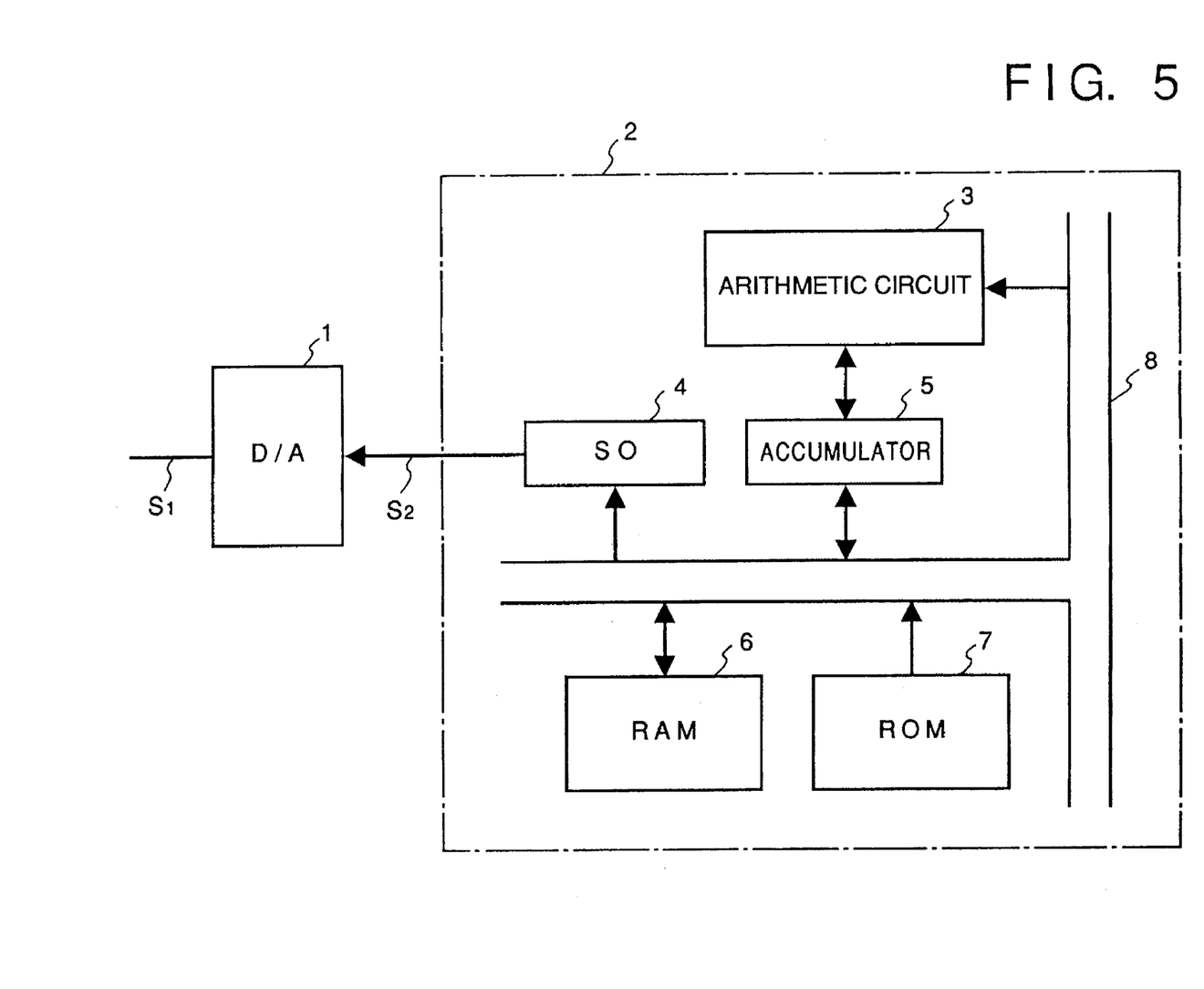
FIG. 5 is a block diagram illustrating the construction of a signal processing apparatus in a second embodiment.

FIG. 5 is a block diagram illustrating the construction of a signal processing unit in the present embodiment. Numeral 1 is a D/A converter for inputting two's complement type digital data $S_2$ in N-bit length, converting to the analog signal $S_1$, and outputting it. Numeral 2 is a digital signal processor which has no instruction to convert two's complement type data into floating-point type data (the floating-point type DSP). The floating-point type DSP converts the floating-point type data to the two's complement type data $S_2$ by combining a plurality of instructions. Numeral 3 is an arithmetic circuit for performing the arithmetic processing in accordance with the procedure which is described later. Numeral 4 is an output register (SO) for outputting the two's complement type digital data $S_2$. Numeral 5 is an accumulator in M-bit length and the detail will be described later. Numeral 6 is a RAM which is used as a work area when the signal processing is executed. Numeral 7 is a ROM which stores the procedure of the processing shown in FIG. 6 of the DSP 2. Numeral 8 is an internal bus of the DSP 2.

The procedure of the processing in the above construction is described below in accordance with the flowchart shown in FIG. 6.

Figure 7:
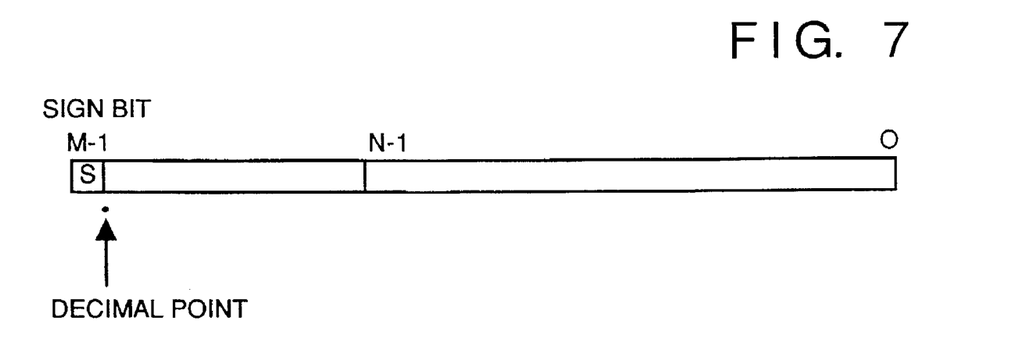
FIG. 7 is a diagram illustrating the bit arrangement of an accumulator in the DSP.

Noted that the bit length N of the two's complement type digital data $S_2$ from the DSP 2 is 16 bits and the bit length M of the accumulator 5 is 24 bits. FIG. 7 is a diagram illustrating the bit arrangement of the accumulator 5. The dot indicates the position of decimal point and "S" of No. M−1 bit indicates a sign bit. It is assumed that the floating-point type data $D_0$ is set in the accumulator 5 immediately before the start of the processing. The floating-point type data $D_0$ is in the range shown in the equation (1):

$$-2^{-(M-N)} < D_0 < +2^{-(M-N)} \quad (1)$$

Figure 6:
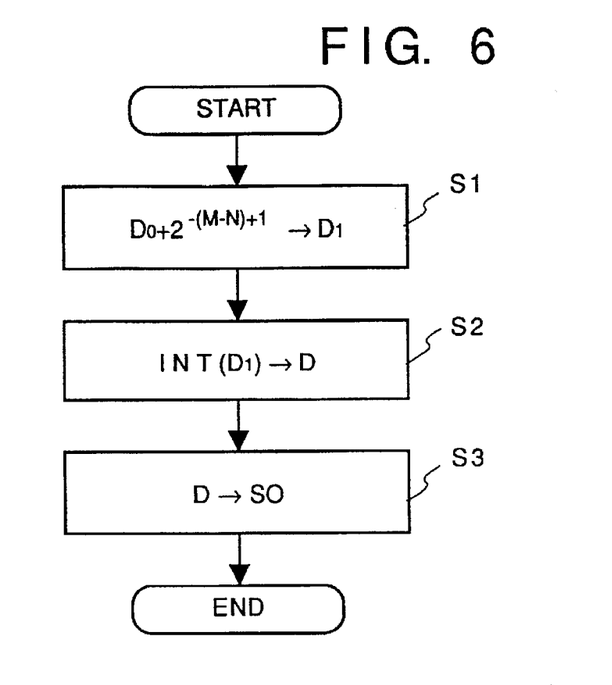
FIG. 6 is a flowchart illustrating the procedure of a processing in the second embodiment.

The DSP 2 operates the arithmetic circuit 3 in accordance with the instruction stored in the ROM 7 and executes the signal processing shown in FIG. 6.

At step S1, the instruction [+] to add the offset value ($2^{-(M-N)+1}$) to the accumulator 5 is executed. When step S1 ends, the value of the accumulator 5 becomes $D_1$ as shown in Eq. (2):

$$D_1 = D_0 + 2^{-(M-N)+1} \quad (2)$$

From Eq. (1), the value of $D_1$ is positive as Eq. (3):

$$0 < 2^{-(M-N)} < D_1 < 3 \cdot 2^{-(M-N)} \quad (3)$$

At step S2, the instruction [INT] for converting a data format is executed. The instruction [INT] converts the data format of the data $D_1$ in the accumulator 5 from the floating-point type to sign magnitude fixed-point type. When step S2 ends, the N-bit in the lower order of the bit pattern $\underline{d}$ expresses $D_0$ in the two's complement type. If Eq. 4 is held, $D_1$ which has been converted to the sign magnitude fixed-point type data is expressed as Eq. (5):

$$\underline{d} = (S, d_{M-2}, d_{M-3}, \ldots, d_0) \quad (4)$$

$$D_1 = (-1)^S \sum_{i=0}^{M-2} d_i \cdot 2^{-(M-N)+i} \quad (5)$$

From the above Eq. (3), it is known that Eqs. (6) and (7) are held:

$$S=0, d_{M-2}=d_{M-1}= \ldots =d_{N-1}=0 \quad (6)$$

$$(d_N, d_{N-1})=(0, 1) \text{ OR } (1, 0) \quad (7)$$

If Eq. (6) is substituted for Eq. (5), Eq. (8) is obtained:

$$\begin{aligned} D_1 &= \sum_{i=0}^{N} d_i \cdot 2^{-(M-1)+i} \quad (8) \\ &= d_N \cdot 2^{-(M-1)+N} + (2-1) \cdot d_{N-1} \cdot \\ & \quad 2^{-(M-1)+(N-1)} + \sum_{i=0}^{N-2} d_i \cdot 2^{-(M-1)+i} \\ &= d_N \cdot 2^{-(M-1)+N} + 2 \cdot d_{N-1} \cdot 2^{-M+N} - \\ & \quad d_{N-1} \cdot 2^{-M+N} + \sum_{i=0}^{N-2} d_i \cdot 2^{-(M-1)+i} \\ &= (d_N + d_{N-1}) \cdot 2^{-(M-1)+N} + \\ & \quad \left\{ -d_{N-1} \cdot 2^{-M+N} + \sum_{i=0}^{N-2} d_i \cdot 2^{-(M-1)+i} \right\} \end{aligned}$$

Furthermore, from Eq. (7), Eq. (9) is obtained:

$$D_1 = 2^{-(M-1)+N} + \left\{ -d_{N-1} \cdot 2^{-M+N} + \sum_{i=0}^{N-2} d_i \cdot 2^{-(M-1)+i} \right\} \quad (9)$$

From Eqs. (2) and (9), Eq. (10) is obtained:

$$D_0 = -d_{N-1} \cdot 2^{-M+N} + \sum_{i=0}^{M-2} d_i \cdot 2^{-(M-1)+i} \quad (10)$$

The N-bit in the lower order ($d_{N-1}, d_{N-2}, \ldots, d_0$) of the accumulator 5 after the completion of the instruction [INT] expresses $D_0$ in the two's complement type.

At step S3, the data of the accumulator 5 is transferred to the SO register 4. Since the bit length of the SO register 4 is N, only the N-bit in the lower order of the accumulator 5 is transferred to the SO register 4.

Accordingly, the data $S_2$ in the SO register 4 is converted to the data expressing $D_0$ in the two's complement type. D/A conversion is performed on this data by the D/A converter 1 and the analog signal $S_1$ corresponding to $D_0$ is outputted.

As described above, according to the embodiment, the floating-point type data can be converted to the two's complement type $S_2$ data by the software of the DSP by adding the floating-point type data and converting to the sign magnitude fixed-point type data.

Accordingly, hardware which converts the floating-point type data into two's complement type data is not necessary and cost of the apparatus can be reduced.

The present invention can be applied to a system constituted by a plurality of devices, or to an apparatus comprising a single device.

Furthermore, it goes without saying that the invention is applicable also to a case where the object of the invention is attained by supplying a program to a system or apparatus.

As described above, according to the first embodiment, it is possible to detect the level fluctuation and level recovery of the input signal and, error variance based on the judged error of the equalized signal, and update the tap coefficient of the adaptive equalizer in accordance with the result, resulting in improvement of reliability of the adaptive equalizer.

According to the other embodiment, it is possible to convert floating-point type data to two's complement type data by simple calculation without additional hardware for conversion.

As many apparently widely different embodiments of the present invention can be made without departing from the spirit and scope thereof, it is to be understood that the invention is not limited to the specific embodiments thereof except as defined in the appended claims.

What is claimed is:

1. An equalizer comprising:

first detection means for detecting the level fluctuation of an input signal;

second detection means for detecting the average level of the input signal;

third detection means for detecting the error variance in accordance with the judged error of the signal which is equalized by an equalizer;

updating means for updating characteristics of the equalizer; and permission means for permitting updating by said updating means in accordance with the result of detection of said first, second, and third detection means, wherein said permission means permits the updating in a case where the error variance is within a predetermined range for a time which is predetermined so that the input signal whose error variance is out of the predetermined range does not remain in the equalizer.

2. The equalizer according to claim 1, wherein said permission means includes:

counter means for counting a number of times where the results of detection of said first, second, and third detection means are predetermined states, and said permission means permitting updating of the tap coefficient of said equalizer by said updating means in accordance with the result of counting by said counter means.

3. An equalizing apparatus comprising:

an equalizer for equalizing an input signal;

first detection means for detecting variance of error of the signal equalized by said equalizer;

second detection means for detecting the average level of the input signal;

updating means for updating characteristics of the equalizer; and permission means for permitting updating by said updating means in accordance with the variance detected by said first detecting means and the average level detected by said second detection means, wherein said permission means permits the updating in a case where the variance is within a predetermined range for a time which is predetermined so that the input signal whose variance is out of the predetermined range does not remain in the equalizer.

4. An equalizing apparatus comprising:

first detection means for detecting the level fluctuation of an input signal;

second detection means for detecting the average level of the input signal;

updating means for updating characteristics of an equalizer; and permission means for permitting updating by said updating means in a case where the result of detection of said first and second detection means is a predetermined state for a predetermined time proportional to the number of registers in the equalizer.

5. A reception system comprising:

an equalizer for equalizing an input signal;

judging means for judging original data from the signal equalized by said equalizer;

first detection means for detecting variance of the judged error of said judging means;

second detection means for detecting the average level of the input signal;

updating means for updating the characteristics of the equalizer;

permission means for permitting updating by said updating means in accordance with the variance detected by said first detection means and the average level detected by said second detection means; and a reception terminal for processing the signal judged by said judging means, wherein said permission means permits the updating in a case where the variance is within a predetermined range for a time which is predetermined so that the input signal whose variance is out of the predetermined range does not remain in the equalizer.

6. A reception apparatus comprising:

reception means for receiving a signal from a line, said reception means having updating means for updating characteristics of the reception; and permission means for permitting updating the characteristics of the reception updated by said updating means in accordance with the error between the signal received by said reception means and the original data, wherein said permission means permits the updating in a case where the error is within a predetermined range for a time which is predetermined so that the signal whose error is out of the predetermined range does not remain in said reception means.

7. The reception apparatus according to claim 6, wherein said reception means includes equalizing means.

8. The reception apparatus according to claim 6, wherein said permission means permits updating the characteristics of the reception in accordance with the level fluctuation of the reception signal, the average level of the reception signal, and the error of the reception signal.

9. The reception apparatus according to claim 6, wherein said permission means comprises judging means for judging whether the error variance of the reception signal is larger than the predetermined value or not.

10. An equalizing apparatus comprising:

reception means for receiving a signal from a line;

equalizing means for equalizing the signal received by said reception means, said equalizing means having updating means for updating characteristics of the equalizing means;

first judging means for judging original data in accordance with the signal equalized by said equalizing means;

second judging means for judging whether or not the error between the signal equalized by said equalizing means and the original data judged by said judging means is less than a predetermined value; and permission means for permitting updating the characteristics of the equalizing updated by said updating means in the case where the error between the signal equalized by said equalizing means and the original data judged by said judging means is less than the predetermined value, wherein said permission means permits the updating in a case where the error is within a predetermined range for a time which is predetermined so that the signal whose error is out of the predetermined range does not remain in said equalizing means.

11. The equalizing apparatus according to claim 10, wherein said permission means permits updating the characteristics of the equalizing in accordance with the reception level fluctuation of the reception signal, the average level of the reception signal, and the error.

12. A reception apparatus comprising:

reception means for receiving a signal from a line, said reception means having updating means for updating characteristics of the reception;

judging means for judging original data based on the signal received by said reception means;

decoding means for decoding the original data judged by said judging means;

permission means for permitting updating the characteristics of the reception updated by said updating means in accordance with the error between the signal received by said reception means and the original data judged by said judging means; and a reception terminal for processing the signal decoded by said decoding means, wherein said permission means permits the updating in a case where the error is within a predetermined range for a time which is predetermined so that the signal whose error is out of the predetermined range does not remain in said reception means.

13. The reception apparatus according to claim 12, wherein said reception means includes equalizing means.

14. The reception apparatus according to claim 12, wherein said permission means permits updating the characteristics of the reception in accordance with the level fluctuation of the reception signal, the average level of the reception signal, and the error of the reception signal.

15. The reception apparatus according to claim 9, wherein said permission means comprises judging means for judging whether the error variance of the reception signal is larger than the predetermined value or not.

16. The reception apparatus according to claim 12, wherein said reception means has storage means for storing the signal, and said predetermined time is proportional to the capacity of said storage means.

17. The equalizing apparatus according to claim 3, wherein said predetermined time is proportional to the number of registers in said equalizer.

18. The reception system according to claim 5, wherein said predetermined time is proportional to the number of registers in said equalizer.

19. The reception apparatus according to claim 6, wherein said reception means has storage means for storing the signal, and said predetermined time is proportional to the capacity of said storage means.

20. The equalizing apparatus according to claim 10, wherein said reception means has storage means for storing the signal, and said predetermined time is proportional to the capacity of said storage means.

21. A reception apparatus comprising:
   reception means for receiving a signal from a line;
   detection means for detecting the average level of the received signal;
   updating means for updating characteristics of the reception; and
   permission means for permitting updating by said updating means in a case where the average level detected by said detection means is within a predetermined range for a time which is predetermined so that the signal whose average level is out of the predetermined range does not remain in said reception means.

22. The reception apparatus according to claim 21, wherein said reception means includes equalizing means, and said detection means detects the average level of the received signal before said equalizing means equalizes the signal.

23. The reception apparatus according to claim 21, wherein said reception means has storage means for storing the signal, and said predetermined time is proportional to the capacity of said storage means.

24. An equalizing characteristics updating method comprising the steps of:
   equalizing an input signal;
   judging whether or not the average level of the input signal is recovered;
   judging original data from the equalized signal;
   judging equalizing error based on the difference between the original data and equalized signal; and
   determining that the equalizing characteristics should be updated in the case where the average level of the input signal is recovered and the equalizing error is lower than a predetermined level.

25. The equalizing characteristics updating method according to claim 24, wherein equalizing error is judged for a predetermined time in said judging step.

26. The equalizing characteristics updating method according to claim 25, wherein the predetermined time is proportional to the number of registers for equalizing.

27. The equalizing characteristic updating method according to claim 24, wherein judging whether or not the average level of the input signal is recovered includes judging whether or not the average level of the received signal is in a predetermined range.

28. The equalizing apparatus according to claim 4, wherein said first detection means detects the level fluctuation by judging whether the level of the input signal is out of a first range, and said second detection means detects the level recovery by judging whether the average level of the input signal is in a second range.

29. The reception apparatus according to claim 21, wherein said detection means detects the average level recovery by judging whether the average level of the received signal is in a predetermined range.

30. The reception apparatus according to claim 21, further comprising judging means for judging original data from the received signal; and
   wherein said permission means permits updating in accordance with the detection of said detection means and the difference between the original data and the received signal.

* * * * *